(12) United States Patent
Yokoyama et al.

(10) Patent No.: US 7,524,371 B2
(45) Date of Patent: Apr. 28, 2009

(54) METHOD FOR MANUFACTURING DEFECT-FREE SILICON SINGLE CRYSTAL

(75) Inventors: Takashi Yokoyama, Kanagawa (JP); Toshiaka Saishoji, Kanagawa (JP); Toshirou Kotooka, Kanagawa (JP); Kazuyoshi Sakatani, Kanagawa (JP)

(73) Assignee: Sumco Techxiv Corporation, Kanagawa (JP)

( * ) Notice: Subject to any disclaimer, the term of this patent is extended or adjusted under 35 U.S.C. 154(b) by 0 days.

(21) Appl. No.: 11/728,739

(22) Filed: Mar. 27, 2007

(65) Prior Publication Data
US 2007/0227439 A1 Oct. 4, 2007

(30) Foreign Application Priority Data
Mar. 28, 2006 (JP) ............................. 2006-087388

(51) Int. Cl.
*C30B 15/20* (2006.01)
(52) U.S. Cl. .................. 117/14; 117/13; 117/30; 117/32; 117/214; 117/917
(58) Field of Classification Search ............... 117/13, 117/14, 15, 208, 217, 218, 222, 30, 32, 214, 117/917
See application file for complete search history.

(56) References Cited

U.S. PATENT DOCUMENTS

| | | | | |
|---|---|---|---|---|
| 5,766,347 | A * | 6/1998 | Shimomura et al. | 117/217 |
| 5,997,635 | A * | 12/1999 | Kubota et al. | 117/14 |
| 6,562,134 | B1 * | 5/2003 | Maeda et al. | 117/222 |
| 6,632,280 | B2 * | 10/2003 | Hoshi et al. | 117/217 |
| 6,712,904 | B1 * | 3/2004 | Sonnenberg et al. | 117/222 |
| 6,733,585 | B2 * | 5/2004 | Inagaki et al. | 117/13 |
| 6,858,076 | B1 * | 2/2005 | Nakajima et al. | 117/13 |
| 6,869,478 | B2 * | 3/2005 | Nakamura et al. | 117/14 |
| 6,977,010 | B2 * | 12/2005 | Inagaki et al. | 117/217 |
| 7,160,386 | B2 * | 1/2007 | Shiraishi et al. | 117/13 |
| 7,329,317 | B2 * | 2/2008 | Maeda et al. | 117/20 |
| 2006/0292890 | A1 * | 12/2006 | Ammon et al. | 438/770 |
| 2008/0311021 | A1 * | 12/2008 | Inagaki et al. | 423/349 |

FOREIGN PATENT DOCUMENTS

| | | | |
|---|---|---|---|
| JP | 2000-072590 | A | 3/2000 |
| JP | 2001-261482 | A | 9/2001 |
| JP | 2001-261495 | A | 9/2001 |
| JP | 3573045 | B | 7/2004 |

* cited by examiner

*Primary Examiner*—Felisa C Hiteshew
(74) *Attorney, Agent, or Firm*—Occhiuti Rohlicek & Tsao LLP

(57) ABSTRACT

A method for controlling the temperature gradient on the side surface of a silicon single crystal, the height of a solid-liquid interface, and the oxygen concentration in the longitudinal direction of the silicon single crystal is provided in order to manufacture a defect-free silicon single crystal whose oxygen concentration is controlled to a predetermined value rapidly and stably. By disposing a cylindrical cooler around the silicon single crystal, and adjusting the pulling speed of the silicon single crystal, the rotation speed of a crucible that stores molten silicon and the rotation speed of the silicon single crystal, and the output ratio of a multi-heater separated into at least two in the longitudinal direction of the silicon single crystal disposed around the crucible, the temperature gradient on the side surface, the height of the solid-liquid interface, and the oxygen concentration in the longitudinal direction of the silicon single crystal are controlled.

16 Claims, 11 Drawing Sheets

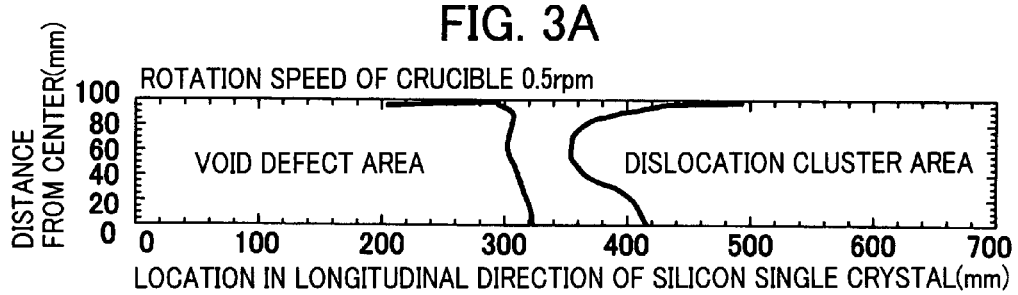
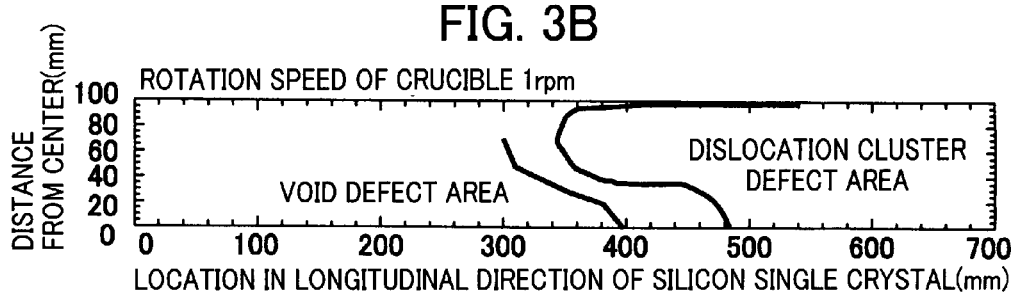
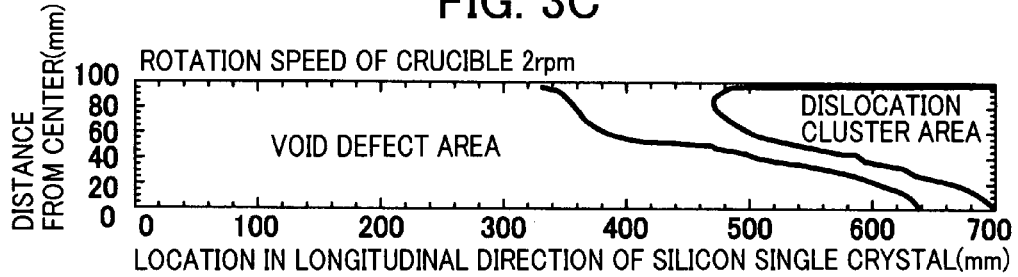
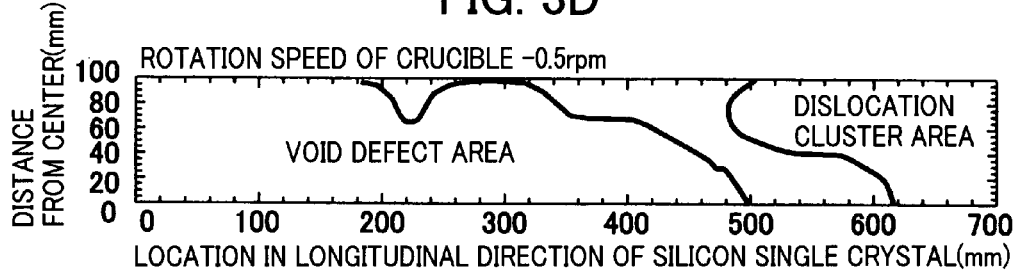

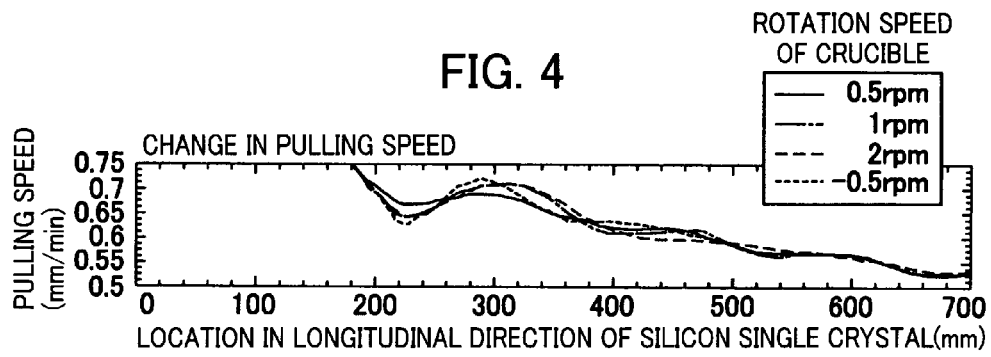
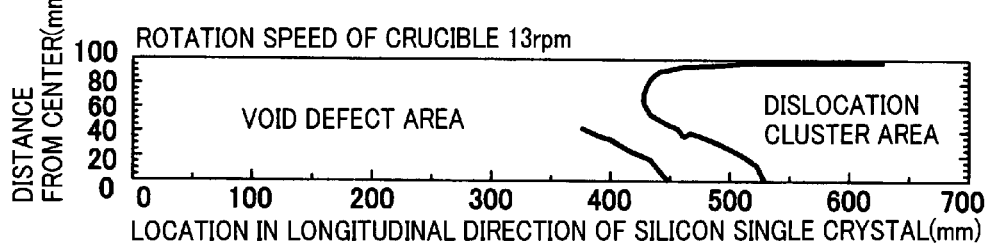
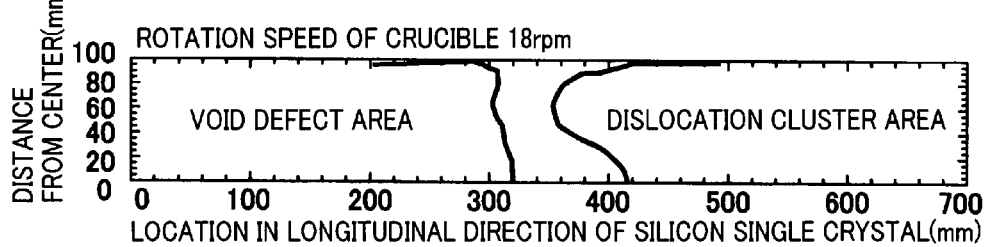
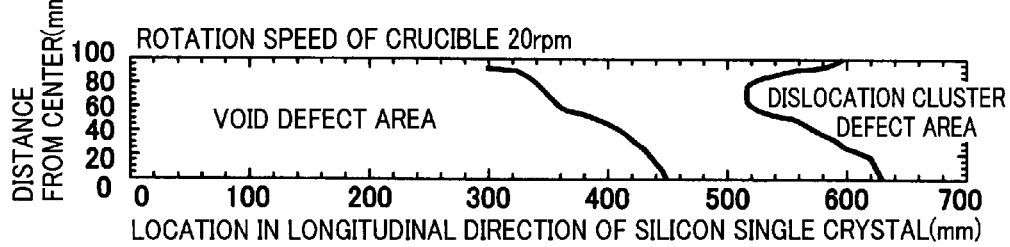

METHOD FOR MANUFACTURING DEFECT-FREE SILICON SINGLE CRYSTAL

This application is based on and claims the benefit of priority from Japanese Patent Application No. 2006-087388, filed on 28 Mar. 2006, the content of which is incorporated herein by reference.

BACKGROUND OF THE INVENTION

1. Field of the Invention

The present invention relates to a method for manufacturing a defect-free silicon single crystal by pulling up the silicon single crystal from molten silicon by the CZ method.

2. Related Art

A high-purity silicon single crystal (hereinafter abbreviated as "crystal" in some cases) is used in general for semiconductor device substrates, and the most widely-employed method for manufacturing it is the Czochralski method (hereinafter, CZ method). In an apparatus for manufacturing a silicon single crystal by the CZ method (silicon single crystal pulling apparatus, CZ furnace), a self-rotating crucible 108 is installed at the center of a chamber 102 so that it can freely go up and down as shown in FIG. 19. The crucible 108 consists of a quartz crucible 108b housed in a graphite crucible 108a. Bulk polycrystalline silicon is loaded into the quartz crucible 108b, and the raw material is heated and melted by a cylindrical heater 105 provided surrounding the crucible 108 to produce molten silicon 103. Subsequently, a seed crystal attached to a seed holder 109 is dipped into the molten silicon 103, and the seed holder 109 is pulled upward while the seed holder 109 and the crucible 108 are rotated in the same or opposite directions from each other to let a silicon single crystal 107 grow so as to have a predetermined diameter and length.

In the process of manufacturing the silicon single crystal by the above CZ method, crystal defects that may cause degradation of device characteristics occur in some cases during the growth of the silicon single crystal. These crystal defects become obvious in the process of manufacturing the device, which results in degradation of the device's performance.

It is generally thought that crystal defects include the following three kinds of defects.
(1) Void defects that are thought to occur as a result of aggregation of vacancies
(2) Oxidation Induced Stacking Faults (OSF)
(3) Dislocation cluster defect that are thought to occur as a result of aggregation of interstitial silicon It is known that the manner in which these crystal defects occur varies as follows depending on the growth conditions.
(1) When the growth speed is high, the silicon single crystal will have excessive vacancies, and only void defects will occur.
(2) When the growth speed gets lower than that in the above case (1), ring-like OSF's will occur in the vicinity of the outer rim of the silicon single crystal, and void defects will occur on the internal side of the OSF portion.
(3) When the growth speed gets further lower than that in the above (2), the radius of the ring-like OSF's will be reduced, dislocation clusters will occur on the external side of the ring-like OSF portion, and void defects will occur on the internal side of the OSF portion.
(4) When the growth speed gets still further lower than that in the above (3), dislocation cluster defects will occur throughout the entire silicon single crystal.

It is thought that the above phenomena occur because the silicon single crystal changes its state from a state of excessive vacancies to a state of excessive interstitial silicon along with a decrease in the growth speed, and it is understood that the change starts at the outer rim side of the silicon single crystal.

OSF's degrade the electrical characteristics, for example, they increase leak currents, and ring-like OSF's contain defects that cause such degradations of the characteristics in a high-density manner. Thus, in a normal process of manufacturing a silicon single crystal, the silicon single crystal is developed with a relatively high pulling speed so that the ring-like OSF's are distributed at the outermost rim of the silicon single crystal. By this method, the majority of the silicon single crystal resides on the internal side of the ring-like OSF, which makes it possible to avoid the dislocation cluster defects. Another reason for locating the majority of the silicon single crystal on the internal side of the ring-like OSF is that the gettering effect against heavy-metal contamination occurring in the device manufacturing process is more significant on the internal side portion of the ring-like OSF than on the external side.

On the other hand, there has recently been a trend towards an increased degree of LSI integration, and as a result of this trend, since gate oxide films are becoming thinner, and the temperature in the device manufacturing process is lower, OSF's which readily occur in high-temperature processes tend to occur less frequently. In addition, there is a trend towards reduced oxygen in the crystal. Thus, OSF's such as ring-like OSF's has been less problematic as a factor which degrades device characteristics.

However, it is apparent that void defects occurring mainly in single crystals growing at high speed significantly degrade the pressure resistance characteristics of thinner gate oxide films. This impact is greater especially as device patterns become more precise, which will make it difficult to attempt a high degree of integration.

Accordingly, in the recent manufacture of silicon single crystals, it has become more important to avoid void defects and dislocation cluster defects (hereinafter, defects including these defects shall be referred to as "grown-in defects").

However, even if a silicon single crystal with no grown-in defects (hereinafter referred to as a "defect-free silicon single crystal", which specifically means a silicon single crystal with no grown-in defects when the silicon single crystal is cut in a horizontal direction including the radius direction of the silicon single crystal) is manufactured successfully, the production efficiency is lowered when the pulling speed of the silicon single crystal is low. Thus, it is also an important goal in the silicon single crystal manufacturing process to increase the pulling speed of the single crystal as much as possible. It is further important to extend the allowable range of the pulling speed of the silicon single crystal since the wider the allowable range of the pulling speed of the silicon single crystal is, the more stably defect-free silicon single crystals can be manufactured. Meanwhile, the allowable range of the pulling speed of the silicon single crystal means a range of pulling speeds of the silicon single crystal over which a defect-free silicon single crystal can be produced under predetermined conditions.

Japanese Unexamined Patent Application Publication No. 2001-261495 (hereinafter referred to as Patent Document 1) discloses that conditions for increasing the pulling speed of silicon single crystals and manufacturing defect-free silicon single crystals stably are "to enlarge the temperature gradient in the longitudinal direction of the side surface of the silicon single crystal (temperature gradient on the side surface of the silicon single crystal in the longitudinal direction of the silicon single crystal, temperature gradient on the side surface of the crystal) and to raise the height of the solid-liquid interface". Meanwhile, "the height of the solid-liquid interface" is defined as the height h of a solid-liquid interface 114 at a crystal center line 107*a* of the silicon single crystal 107 (that is, the height h of the solid-liquid interface at the crystal center) as shown in FIG. 20. Also, "the temperature gradient on the side surface of the crystal" means the temperature gradient in the longitudinal direction on a side surface 107*b* of the silicon single crystal 107, and conditions in which this "temperature gradient on the side surface of the crystal" is enlarged is hereinafter referred to as a "large temperature gradient condition".

However, prior art documents do not disclose specifically the means or conditions under which the silicon single crystal may be pulled up in order to "enlarge the temperature gradient on the side surface of the crystal and to raise the height of the solid-liquid interface".

For example, Japanese Patent No. 3573045 (hereinafter referred to as Patent Document 2) discloses an invention using a cooling member (cooler) to enlarge the temperature gradient on the side surface of the crystal in manufacturing a high-quality silicon single crystal. More specifically, it proposes an invention defining the arrangement and dimensions of a cooling member (cooler) 120 (refer to FIG. 19), the extent (high/low) of the temperature at the central part and at the circumferential part (side surface of the crystal) of the silicon single crystal within the temperature range from the solidifying point to 1250 degrees C., and the extent (large/small) of the temperature gradient at the central part and at the circumferential part of the silicon single crystal, as an invention of a method for enabling the stable manufacture of defect-free silicon single crystals.

However, Patent Document 2 discloses nothing about the height of the solid-liquid interface. As will be described hereinbelow, since the height of the solid-liquid interface varies depending on the conditions of pulling up the silicon single crystal, defect-free silicon single crystals may not be obtained even when the silicon single crystal is pulled up under the same conditions as in the invention disclosed in Patent Document 2. That is, since the invention disclosed in Patent Document 2 does not define anything about the height of the solid-liquid interface, defect-free silicon single crystals can be manufactured in some cases and cannot be manufactured in other cases depending on the conditions of pulling up the silicon single crystal when the invention is practiced.

Further, Patent Document 2 does not disclose specifically how to embody the configuration of the invention disclosed in Patent Document 2, for example, the extent (high/low) of the temperature at the central part and at the circumferential part of the silicon single crystal, the extent (large/small) of the temperature gradient at the central part and at the circumferential part of the silicon single crystal, and so on.

Also, Japanese Unexamined Patent Application Publication No. 2000-72590 (hereinafter referred to as Patent Document 3) proposes an invention of a method for developing defect-free silicon single crystals by controlling the number of rotations of a crucible per unit time (rotation speed of the crucible) and the number of rotations of the silicon single crystal per unit time (rotation speed of the silicon single crystal). Specifically, as conditions of pulling up the silicon single crystal for minimizing grown-in defects, the number of rotations of the silicon single crystal per unit time is set to 13 rotations/min or more, and the number of rotations of the crucible per unit time is set to 5 rotations/min or less. An object of this invention is to obtain defect-free silicon single crystals by reducing the pulling speed of the silicon single crystal so that the ring-like OSF is located at the central side of the silicon wafer and making the shape of the solid-liquid interface flat or upward-projecting convex.

However, the invention disclosed in Patent Document 3 does not show if the height of the solid-liquid interface can be raised sufficiently even in the case of the large temperature gradient condition using a cooling member. Meanwhile, the oxygen concentration is an important quality management issue in manufacturing silicon wafers. This is because silicon wafers cut out from a portion of a silicon single crystal where the oxygen concentration is high tend to have surface defects as the oxygen in the crystal is precipitated during a heat treatment. Thus, it is at least desired that the oxygen concentration in the silicon single crystal should be constant in the longitudinal direction of the crystal. However, if the rotation speed of the crucible is changed, the oxygen concentration in the silicon single crystal may be changed in the longitudinal direction of the crystal. Therefore, the invention disclosed in Patent Document 3 is not practical.

Further, Japanese Unexamined Patent Application Publication No. 2001-261482 (hereinafter referred to as Patent Document 4) discloses an invention of a method for restricting the occurrence of dislocation cluster defects by adjusting the output (heater power ratio) of a multi-heater separated in the up and down directions, instead of the heater 105 shown in FIG. 19, to result in different heating distributions for the molten silicon in a crucible in the up and down directions.

However, the invention disclosed in Patent Document 4 does not show if the height of the solid-liquid interface can be raised sufficiently even in the case of a large temperature gradient condition using a cooling member. Also, the oxygen concentration in the silicon single crystal is determined by the amount of oxygen eluted into the molten silicon from the inner wall at the bottom portion of the crucible. When the heater power ratio is adjusted, the amount of oxygen eluted into the molten silicon is changed as a matter of course. Thus, if the heater power ratio is adjusted, the oxygen concentration in the longitudinal direction in the silicon single crystal needs to be controlled to maintain the specifications. However, Patent Document 4 makes no mention of this.

As described above, various proposals are provided about how to raise the height of the solid-liquid interface under a large temperature gradient in order to manufacture a defect-free silicon single crystal rapidly and stably, but specific means and conditions have not always been disclosed. Also, even if the height of the solid-liquid interface were raised sufficiently under the conditions of a large temperature gradient by the aforementioned methods, no specific manufacturing conditions are provided, and the aforementioned proposes are problematic in that the oxygen concentration in the silicon single crystal, which is an important quality management issue in manufacturing silicon single crystals, is not controlled.

SUMMARY OF THE INVENTION

The present invention has been made to solve the foregoing problems, and an object of the present invention is to provide a method for controlling the temperature gradient on the side surface of a silicon single crystal, the height of a solid-liquid interface, and the oxygen concentration in the longitudinal direction of the silicon single crystal in order to manufacture a defect-free silicon single crystal whose oxygen concentration is controlled to a predetermined value rapidly and stably.

In order to achieve the above object, the present invention is characterized by finding the specific conditions required for manufacturing defect-free silicon single crystals whose oxygen concentration is controlled to a predetermined value rapidly and stably, and as a result, controlling the temperature gradient on the side surface of a silicon single crystal, the height of a solid-liquid interface, and the oxygen concentration in the longitudinal direction of the defect-free silicon single crystal.

The first aspect of the present invention is a method for manufacturing a defect-free silicon single crystal by the CZ method, comprising the steps of disposing a cylindrical cooler around a silicon single crystal, and, by adjusting a pulling speed of the silicon single crystal, a rotation speed of a crucible that stores molten silicon and a rotation speed of the silicon single crystal, and an output ratio of a multi-heater separated into at least two in the longitudinal direction of the silicon single crystal disposed around the crucible, controlling a temperature gradient on the side surface of the silicon single crystal in the longitudinal direction of the silicon single crystal, a height of a solid-liquid interface, and an oxygen concentration in the longitudinal direction of the silicon single crystal, to manufacture a defect-free silicon single crystal.

The second aspect of the present invention is the method according to the first aspect, wherein the multi-heater consists of an upper heater and a lower heater located below this upper heater, and an output ratio of the upper heater to the lower heater is set to 0.9 or more and 3.5 or less.

The third aspect of the present invention is the method according to the first aspect, wherein the multi-heater consists of a cylindrical side heater disposed around the crucible and a bottom heater disposed on the lower side of the crucible, and an output ratio of the side heater to the bottom heater is set to 0.9 or more and 3.5 or less.

The fourth aspect of the present invention is the method according to the second or third aspect, wherein the output ratio is set to 0.9 or more and 1.5 or less.

The fifth aspect of the present invention is the method according to any one of the second to fourth aspects, wherein the output ratio is changed and adjusted in the longitudinal direction of the silicon single crystal.

The sixth aspect of the present invention is the method according to any one of the second to fourth aspects, wherein the rotation speed of the crucible is set to 0.5 rpm or more and 1 rpm or less.

The seventh aspect of the present invention is the method according to any one of the second to sixth aspects, wherein the rotation speed of the silicon single crystal is set to 18 rpm or more and 20 rpm or less in a reverse direction from rotation of the crucible.

The eighth aspect of the present invention is the method according to any one of the first to seventh aspects, further comprising a step of changing and adjusting a distance between a lower edge of a heat shield plate surrounding the silicon single crystal and adjusting an amount of heat radiated onto the silicon single crystal and the surface of the molten silicon in the longitudinal direction of the silicon single crystal.

The ninth aspect of the present invention is the method according to the eighth aspect, wherein the distance between the lower edge of the heat shield plate and the surface of the molten silicon is adjusted in a range from 45 mm or more to 75 mm or less, and the pulling speed of the silicon single crystal is adjusted in a range from 0.45 mm/min or more to 0.70 mm/min or less.

The tenth aspect of the present invention is the method according to any one of the first to ninth aspects, wherein a magnetic field is applied to the molten silicon.

The eleventh aspect of the present invention is a method for manufacturing a defect-free silicon single crystal by the CZ method, comprising a step of, by adjusting a pulling speed of the silicon single crystal, a rotation speed of a crucible that stores molten silicon and a rotation speed of the silicon single crystal, and an output ratio of a multi-heater separated into at least two in the longitudinal direction of the silicon single crystal disposed around the crucible, controlling a temperature gradient on the side surface of the silicon single crystal in the longitudinal direction of the silicon single crystal, a height of a solid-liquid interface, and an oxygen concentration in the longitudinal direction of the silicon single crystal, to manufacture a defect-free silicon single crystal.

According to the present invention, by disposing a cylindrical cooler around the silicon single crystal, and controlling the temperature gradient on the side surface of the silicon single crystal, the height of the solid-liquid interface, and the oxygen concentration in the longitudinal direction of the silicon single crystal by adjusting the pulling speed of the silicon single crystal, the rotation speed of the crucible that stores molten silicon and the rotation speed of the silicon single crystal, and the output ratio of the multi-heater separated into at least two in the longitudinal direction of the silicon single crystal disposed around the crucible, it is possible to manufacture a defect-free silicon single crystal whose oxygen concentration is controlled to a predetermined value rapidly and stably.

BRIEF DESCRIPTION OF THE DRAWINGS

FIGS. 3A to 3D each shows areas where kinds of defects are present at locations in the longitudinal direction of the silicon single crystal and at locations from the center;

FIG. 4 shows the pulling speeds at locations in the longitudinal direction of the silicon single crystal;

FIGS. 5A to 5C each shows areas where types of, defects are present at locations in the longitudinal direction of the silicon single crystal and at locations from the center;

DETAILED DESCRIPTION OF THE INVENTION

<Overview of a Silicon Single Crystal Manufacturing Apparatus>

Figure 1A:
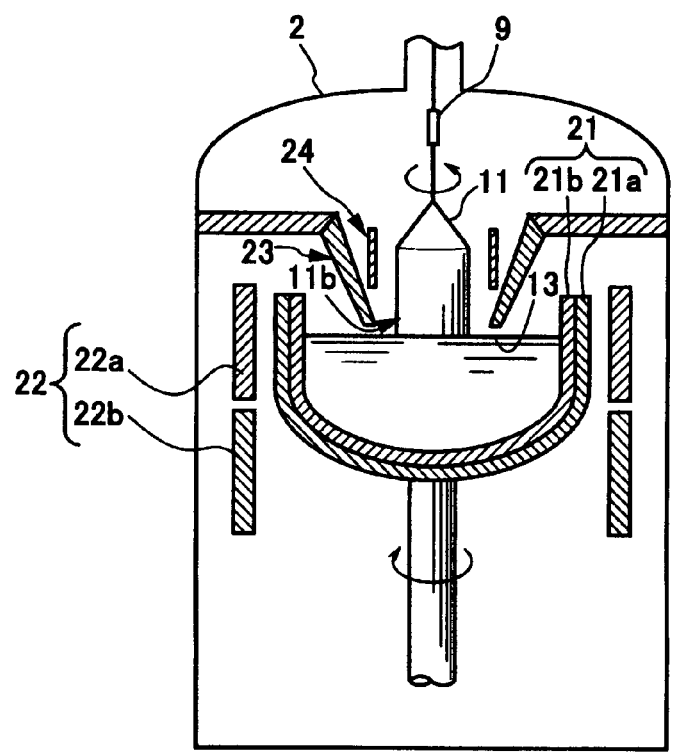
FIGS. 1A and 1B are cross-sectional view schematically showing a CZ furnace in which the apparatus required to execute the present invention are exemplified.

In a hot zone configuration in a silicon single crystal pulling apparatus used for embodying the present invention, more specifically, a CZ furnace, a self-rotating crucible 21 is installed at the center of a chamber 2 so that it can freely go up and down as shown in FIG. 1A. The crucible 21 consists of a quartz crucible 21b housed in a graphite crucible 21a. Bulk polycrystalline silicon is loaded into the quartz crucible 21b, and the raw material is heated and melted by a cylindrical heater 22 provided surrounding the crucible 21 to produce molten silicon 13. Subsequently, a seed crystal attached to a seed holder 9 is dipped into the molten silicon 13, and the seed holder 9 is pulled upward while the seed holder 9 and the crucible 21 are rotated in the same or opposite directions from each other to let a silicon single crystal 11 grow so as to have predetermined diameter and length.

Figure 1B:
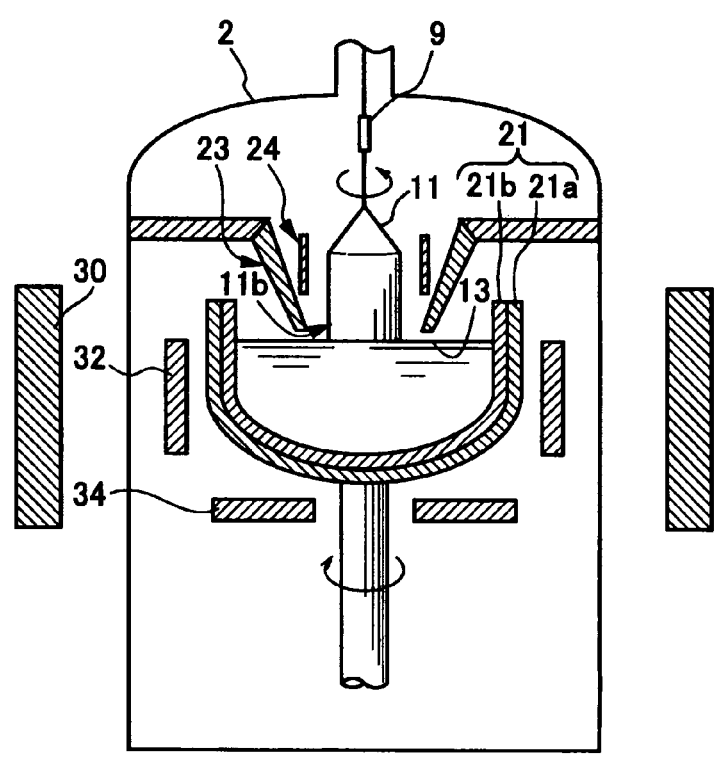

Also, the hot zone configuration of the CZ furnace includes a heat shield body (heat shield plate) 23 surrounding the silicon single crystal 11 rotated and pulled up from the molten silicon 13 and adjusting the amount of heat radiated onto the silicon single crystal 11, and a side surface temperature adjusting apparatus 24 adjusting the temperature of a side surface 11b of the silicon single crystal 11. It is noted that a solenoid 30 to apply a magnetic field to the molten silicon 13 may be provided as shown in FIG. 1B. By providing the solenoid 30 to apply a magnetic field to the molten silicon 13 in the hot zone configuration, the oxygen concentration in the silicon single crystal is controlled more easily.

As shown in FIG. 1A, the heat shield plate 23 is generally constituted by a carbon member and is adapted to control the temperature of the side surface 11b of the silicon single crystal 11 by shielding the radiant heat from the molten silicon 13, etc. Also, the side surface temperature adjusting apparatus 24, which is installed surrounding the silicon single crystal 11 similarly to the heat shield plate 23, is constituted by a member that actively absorbs or adds heat such as a cooler as an example of a cooling member or a heater. It is noted that a configuration in which a cooler as an example of a cooling member is disposed around the silicon single crystal as the side surface temperature adjusting apparatus 24 is described hereinafter, but it is not necessary to adopt a cooling member as the side surface temperature adjusting apparatus 24.

Also, the heater 22 is a multi-heater separated into at least two along the longitudinal direction of the silicon single crystal 11 and is preferably constituted by an upper heater 22a and a lower heater 22b, as shown in FIG. 1A. The outputs of the upper heater 22a and the lower heater 22b can be adjusted respectively, and the output ratio of the upper heater 22a to the lower heater 22b (hereinafter, heater power ratio) can be adjusted freely as a matter of course. The CZ furnace is configured so that the pulling environment when the heater power ratio is 1 corresponds to that when a normal single heater is used.

Meanwhile, although the heater 22 is a multi-heater constituted by the upper heater 22a and the lower heater 22b, it may be constituted by a cylindrical side heater 32 disposed around the crucible and a bottom heater 34 disposed on the lower side of the crucible. In such a case, the outputs of the side heater 32 and the bottom heater 34 can be adjusted independently, and the output ratio of the side heater 32 to the bottom heater 34 can be adjusted freely as a matter of course. Also, the heater 22 may be constituted by one side heater 32. In such a case, it is preferably one whose outputs at the upper part and at the lower part can be adjusted independently. Also, the heater 22 may not be limited to one separated into two, but may be one separated into more than two, such as three or four.

Figure 20:
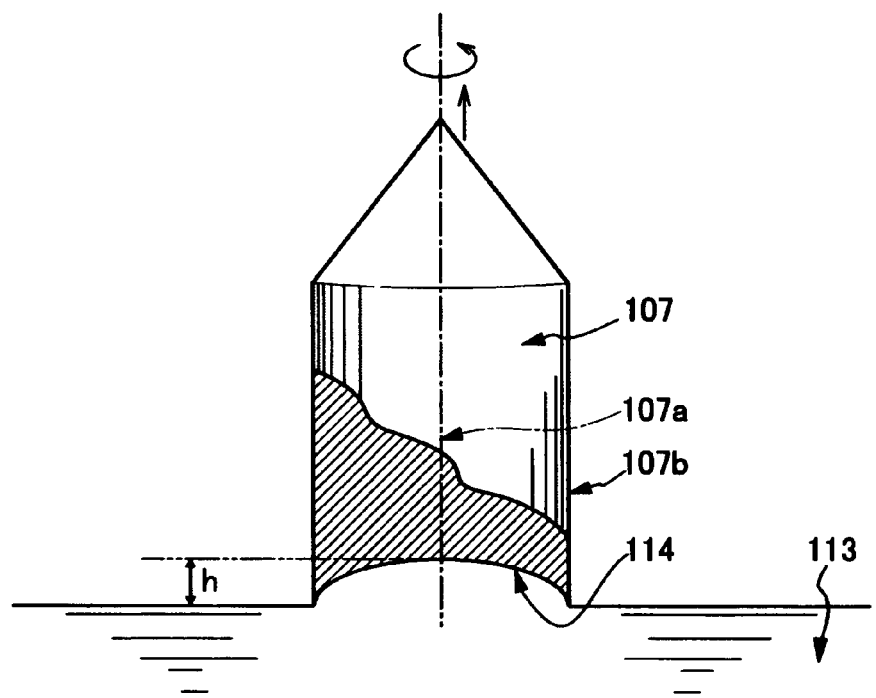
FIG. 20 is a view explaining "the height of the solid-liquid interface".

In addition, as will be described hereinbelow, control and adjustment of convection of the molten silicon 13 and control and adjustment of the height (h in FIG. 20) of a solid-liquid interface for embodying the present invention can be performed by adjusting the number of rotations of the crucible per unit time and the number of rotations of the silicon single crystal per unit time. Alternatively, they can be performed by applying a magnetic field and adjusting the strength of the magnetic field applied. Further, these methods can be combined.

<Principle of the Present Invention>

As described above, it has been conventionally proposed in order to manufacture a defect-free silicon single crystal rapidly and stably that the height of the solid-liquid interface is raised sufficiently under conditions of a large temperature gradient. Accordingly, as premises for manufacturing a defect-free silicon single crystal rapidly and stably, the inventors of the present invention studied whether a defect-free silicon single crystal can be manufactured rapidly and stably by installing a cooler (refer to the cooler 24 in FIG. 1A or 1B) in the silicon single crystal pulling apparatus.

<Large Temperature Gradient Conditions Using a Cooler>

Figure 2A:
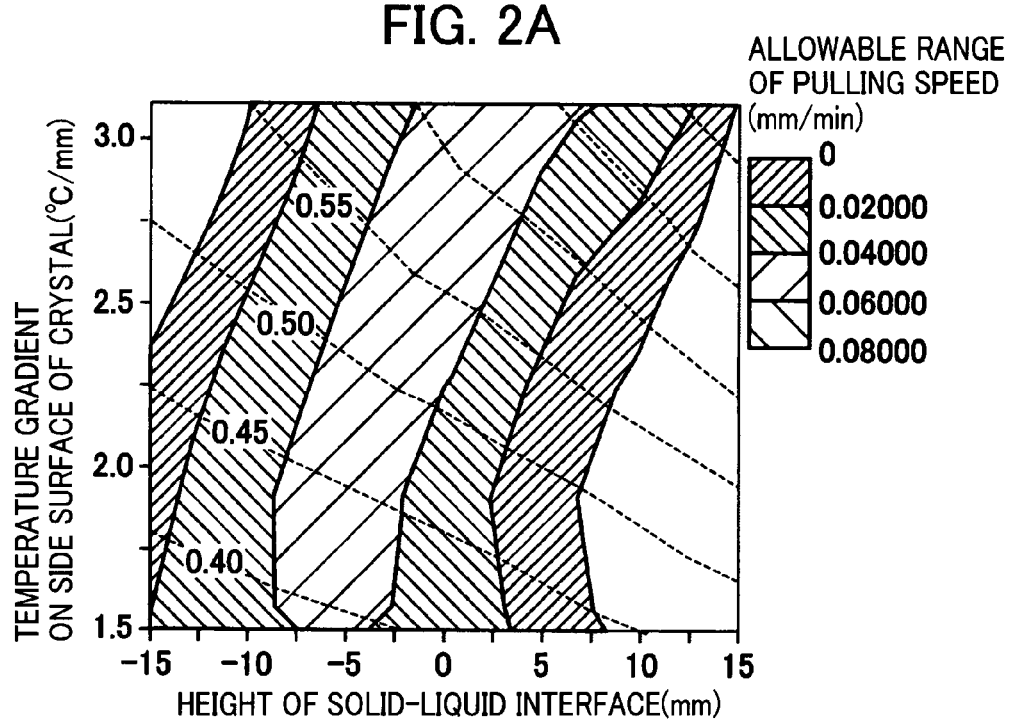
FIGS. 2A and 2B show delta V (the allowable range of the pulling speed of the silicon single crystal (mm/min)) under conditions where the height of the solid-liquid interface (mm) are shown on the horizontal axis, and the temperature gradient on the side surface of the crystal (degrees C./mm) are shown on the vertical axis.
Figure 2B:
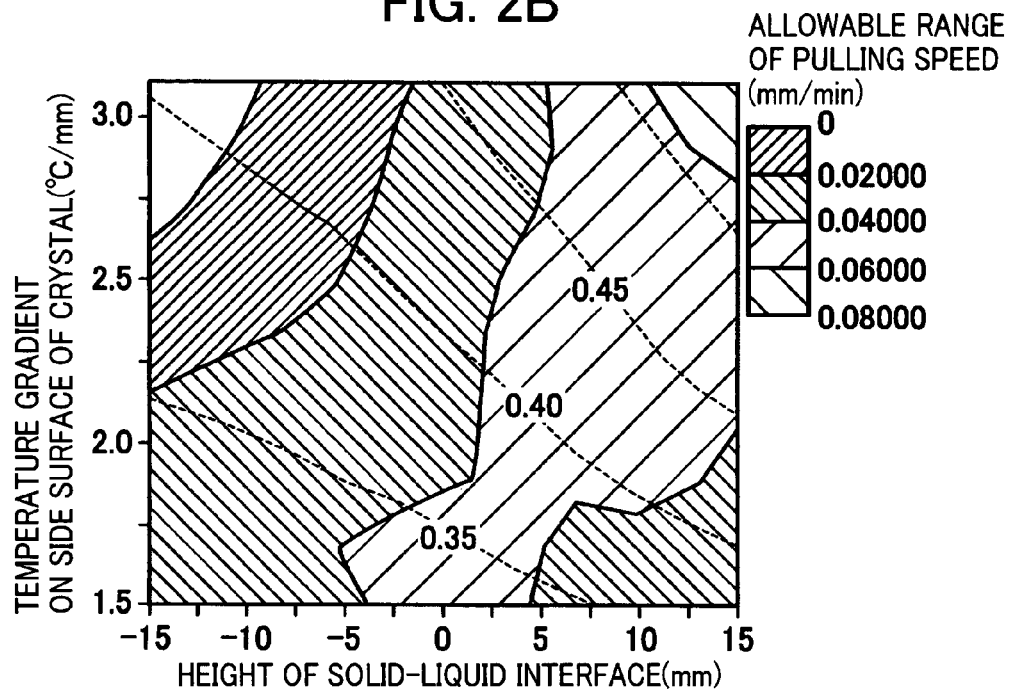

FIGS. 2A and 2B show the delta V (allowable range of the pulling speed of the silicon single crystal (mm/min)) under conditions where the height of the solid-liquid interface (mm) is shown on the horizontal axis, and the temperature gradient on the side surface of the crystal (degrees C./mm) is shown on the vertical axis. FIG. 2A is a graph showing the case where a cylindrical cooler is installed (disposed) in the hot zone in the silicon single crystal pulling apparatus, that is, around the silicon single crystal, and FIG. 2B is a graph showing the case where no cooler is installed. The contour with a number shows the pulling speed of the silicon single crystal (mm/ min), and the space between the contours is the allowable range of the pulling speeds of the silicon single crystal.

Hereinafter, as described above, a defect-free silicon single crystal is a crystal with no void defects or dislocation cluster defects, and a defect-free area is an area with no void defects or dislocation cluster defects. Also, in silicon single crystal pulling described hereinbelow, the length of the cooler was set to 100 mm, the internal diameter of the cooler was set to 270 mm, and the diameter of the silicon single crystal manufactured was set to 207 mm.

Also, the height of the solid-liquid interface was evaluated by pulling up the silicon single crystal, thereafter cutting the crystal in the vertical direction including the crystal axis to obtain a plate-shaped sample, and observing the growth stripes by X-ray topography. The temperature gradient on the side surface of the crystal was derived by total heat transmission analysis.

As shown in FIGS. 2A and 2B, the allowable range of the pulling speed of the silicon single crystal is wider in the case where the cooler is installed in the hot zone in the silicon single crystal pulling apparatus (FIG. 2A) than in the case where no cooler is installed (FIG. 2B) even if the height of the solid-liquid interface is low. Also, the pulling speed of the silicon single crystal to manufacture a defect-free silicon single crystal can be higher in the case of installing the cooler. It can be inferred from the above that installing the cooler provides more appropriate conditions for manufacturing a defect-free silicon single crystal (manufacturing a silicon ingot containing a defect-free area) than the case of not installing the cooler. Also, from FIGS. 2A and 2B, it can be understood that installing the cooler enables control of the temperature gradient on the side surface of the crystal.

<Optimal Rotation Speed to Manufacture a Defect-Free Silicon Single Crystal>

Next, the present inventors examined the optimal conditions for manufacturing a defect-free silicon single crystal by changing the number of rotations of the crucible per unit time (rotation speed of the crucible) and the number of rotations of the silicon single crystal per unit time (rotation speed of the silicon single crystal) in the case of installing the cooler in the hot zone in the silicon single crystal pulling apparatus.

FIGS. 3A to 3D and FIGS. 5A to 5C each show areas where kinds of defects are present at locations in the longitudinal direction of the silicon single crystal (locations from the top side in the longitudinal direction of the silicon single crystal, length of the straight body of the silicon single crystal) and at locations from the center. Meanwhile, the distribution of defect kinds at each location in the silicon single crystal was evaluated by X-ray topography after Secco etching and heat treatment and a Cu decoration method. Also, the area to be evaluated was set to one at and under a 200 mm location in the longitudinal direction of the silicon single crystal excluding the crystal top side.

Specifically, FIG. 3A to 3D each show areas where kinds of defects are present at locations in the longitudinal direction of the silicon single crystal and at locations from the center when the number of rotations of the crucible per unit time (a positive number means opposite rotation to the rotation of the silicon single crystal, and a negative number means regular rotation) is changed under conditions in which the number of rotations of the silicon single crystal per unit time is fixed to 18 rpm. And FIG. 4 shows the pulling speed of the silicon single crystal at locations in the longitudinal direction of the silicon single crystal when the number of rotations of the crucible per unit time is changed under conditions in which the number of rotations of the silicon single crystal per unit time is fixed to 18 rpm. Under the above conditions of pulling up the silicon single crystal, when the number of rotations of the crucible per unit time was 0.5 rpm, a defect-free area was present over the entire area in the radial direction of the silicon single crystal within an area from an approximately 310 mm location to an approximately 350 mm location in the longitudinal direction of the silicon single crystal. Also, the pulling speed of the silicon single crystal when the number of rotations of the crucible per unit time was 0.5 rpm was approximately 0.65 mm/min, which was at least 0.1 mm/min or faster than a conventionally-confirmed pulling speed (approximately 0.43 mm/min).

Figure 6:
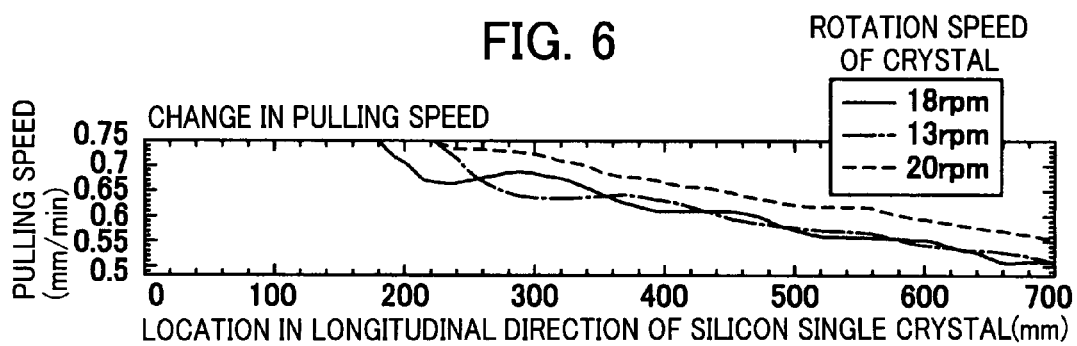
FIG. 6 shows the pulling speed at locations in the longitudinal direction of the silicon single crystal.

Also, FIG. 5A to 5C each show areas where kinds of defects are present at locations in the longitudinal direction of the silicon single crystal and at locations from the center when the number of rotations of the silicon single crystal per unit time is changed under conditions in which the number of rotations of the crucible per unit time is fixed to 0.5 rpm. And FIG. 6 shows the pulling speed of the silicon single crystal at locations in the longitudinal direction of the silicon single crystal when the number of rotations of the silicon single crystal per unit time is changed under conditions in which the number of rotations of the crucible per unit time is fixed to 0.5 rpm. Under the above conditions of pulling up the silicon single crystal, when the number of rotations of the silicon single crystal per unit time was 18 rpm or 20 rpm, a defect-free area was present over the entire area in the radial direction of the silicon single crystal.

Also, from the above results, it is understood that the pulling speed of the silicon single crystal can be controlled by adjusting the number of rotations of the crucible per unit time and the number of rotations of the silicon single crystal per unit time.

<Height of the Solid-Liquid Interface when the Rotation Speed is Changed>

Figure 7A:
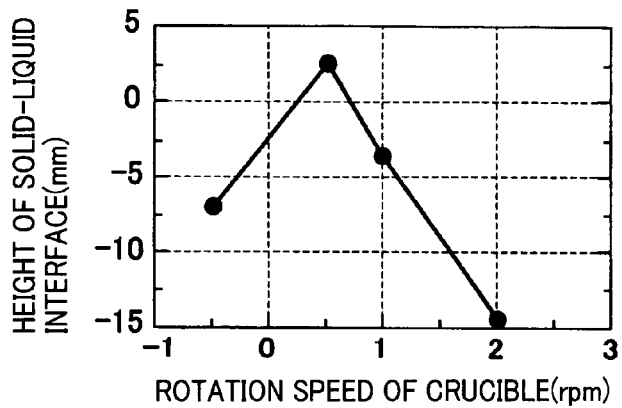
FIGS. 7A and 7B show the height of the solid-liquid interface when the number of rotations of the crucible per unit time or the number of rotations of the silicon single crystal per unit time is changed.
Figure 7B:
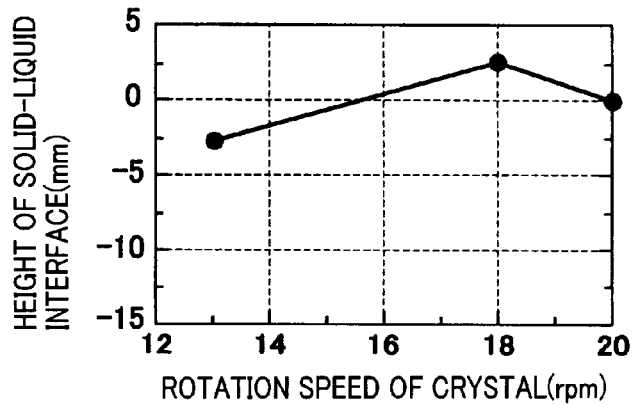

Next, the present inventors studied the optimal conditions for manufacturing a defect-free silicon single crystal by examining changes in the height of the solid-liquid interface when the number of rotations of the crucible per unit time or the number of rotations of the silicon single crystal per unit time were changed. FIGS. 7A and 7B show the height of the solid-liquid interface when the number of rotations of the crucible per unit time or the number of rotations of the silicon single crystal per unit time are changed.

As shown in FIGS. 7A and 7B, the solid-liquid interface is the highest when the number of rotations of the crucible per unit time is 0.5 rpm, and the number of rotations of the silicon single crystal per unit time is 18 rpm. This result and the results shown in FIGS. 3A to 6 make it clear that the defect-free area in the silicon single crystal is larger, and also the pulling speed of the silicon single crystal is faster, for the highest point of the solid-liquid interface. That is, the higher the solid-liquid interface is, the faster the pulling speed of the silicon single crystal is, in which case a defect-free silicon single crystal is easy to manufacture.

Also, from the above results, it is understood that the height of the solid-liquid interface can be controlled by adjusting the number of rotations of the crucible per unit time and the number of rotations of the silicon single crystal per unit time.

<Differences Between Conventional Techniques and the Present Invention>

Now, conventional techniques and findings by the present inventors are compared. An invention disclosed in Patent Document 2 as a conventional invention discloses an invention of installing a cooler in the hot zone for manufacturing a defect-free silicon single crystal, as described above. Specifically, it defines the arrangement and dimensions of a cooler, the extent (high/low) of the temperature at the central part and at the circumferential part of the silicon single crystal within the temperature range from the solidifying point to 1250 degrees C., and the extent (large/small) of the temperature gradient at the central part and at the circumferential part of the silicon single crystal.

The data shown in FIGS. 2A to 7B (excluding FIG. 2B) has been obtained from the experiment in the same configuration regarding the arrangement and dimensions of the cooler as that in the invention disclosed in Patent Document 2. However, even when the same configuration as that in the invention disclosed in Patent Document 2 is adopted, it is clear that the height of the solid-liquid interface and the defect distribution in the silicon single crystal significantly vary depending on the number of rotations of the crucible per unit time and the number of rotations of the silicon single crystal per unit time, as shown in FIGS. 3A to 3D and FIGS. 5A to 5C. For example, as shown in FIGS. 3A to 3D, although a defect-free silicon single crystal can be manufactured when the number of rotations of the silicon single crystal per unit time is 0.5 rpm, a defect-free silicon single crystal can rarely be manufactured under conditions where the number of rotations of the silicon single crystal per unit time is 2 rpm even when the same configuration as that in the invention disclosed in Patent Document 2 is adopted. Accordingly, it is apparent that merely adopting the same configuration as that in the invention disclosed in Patent Document 2 is not sufficient to manufacture a defect-free silicon single crystal.

Also, in an invention disclosed in Patent Document 3, as conditions of pulling up the silicon single crystal for minimizing grown-in defects, the number of rotations of the silicon single crystal per unit time is set to 13 rotations/min or more, and the number of rotations of the crucible per unit time is set to 5 rotations/min or less. An object of this invention is to obtain a defect-free silicon single crystal by lowering the pulling speed of the silicon single crystal so that the ring-like OSF is located at the central side of the silicon wafer and making the shape of the solid-liquid interface flat or upward-projecting convex.

However, as shown in FIGS. 2A to 7B (excluding FIG. 2B), even when the number of rotations of the silicon single crystal per unit time is 13 rotations/min or more, and the number of rotations of the crucible per unit time is 5 rotations/min or less, the height of the solid-liquid interface, the pulling speed of the silicon single crystal, ease of manufacturing a defect-free silicon single crystal, and so on greatly differ. For example, as shown in FIG. 7A, the height of the solid-liquid interface differs as much as 17 mm between the case where the number of rotations of the crucible per unit time is 2 rpm and the case where it is 0.5 rpm, so does the pulling speed of the silicon single crystal, the area of the defect-free area, and the ease of manufacturing a defect-free silicon single crystal. The same is equally true of the number of rotations of the silicon single crystal per unit time from the results shown in FIGS. 5A to 5C.

In contrast to the aforementioned conventional inventions, the present inventors have found from the above results that, in a case where a cooler is installed in the silicon single crystal pulling apparatus, setting the number of rotations of the crucible per unit time to around 0.5 rpm and setting the number of rotations of the silicon single crystal per unit time to around 18 rpm or more and 20 rpm or less are appropriate for manufacturing a defect-free silicon single crystal rapidly.

<Control of Oxygen Concentration in the Silicon Single Crystal>

Figure 8:
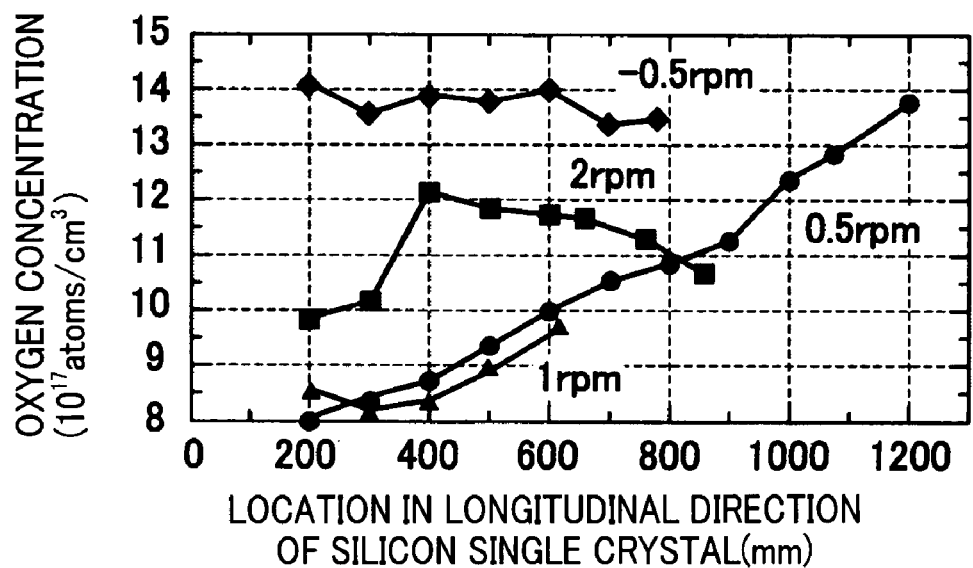
FIG. 8 shows the oxygen concentration in the silicon single crystal at locations in the longitudinal direction of the silicon single crystal.

However, when the number of rotations of the crucible per unit time is fixed or limited, the oxygen concentration in the silicon single crystal changes in the longitudinal direction, as shown in FIG. 8 (for example, when the number of rotations of the crucible per unit time is fixed to 0.5 rpm). FIG. 8 is a graph showing the oxygen concentration in the silicon single crystal at locations in the longitudinal direction of the silicon single crystal, in which oxygen concentration for each number of rotations of the crucible per unit time is shown.

Normally, in order to manufacture a silicon wafer whose oxygen concentration is within a predetermined range, the number of rotations of the crucible per unit time etc. is changed to maintain a constant oxygen concentration in the longitudinal direction of the silicon single crystal. However, if the number of rotations of the crucible per unit time is changed, the height of the solid-liquid interface greatly varies, as described above, and thus a defect-free silicon single crystal cannot be manufactured stably. To this end, the present inventors examined whether the oxygen concentration in the longitudinal direction of the silicon single crystal can be controlled by means other than rotation of the crucible.

Figure 9:
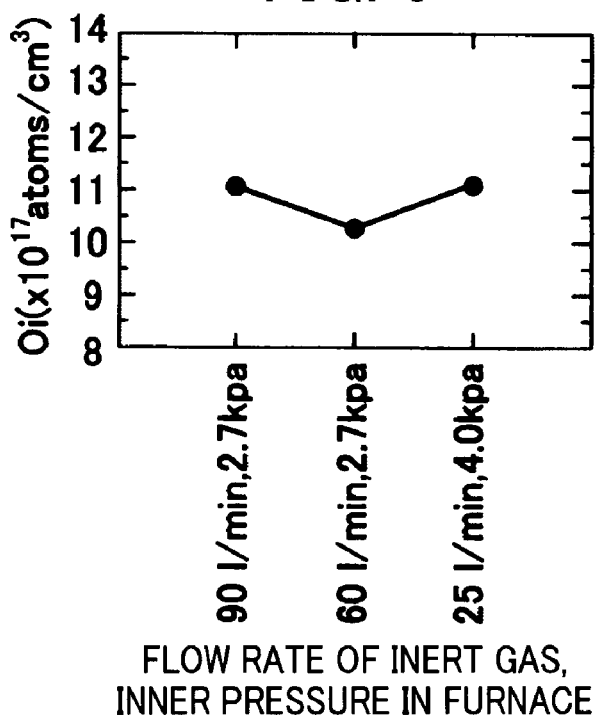
FIG. 9 shows the oxygen concentration in the silicon single crystal when the flow rate of inert gas and the inner pressure in the CZ furnace are changed.

Conventionally, as a method for controlling the oxygen concentration in the silicon single crystal by means other than rotation of the crucible, a method for controlling the oxygen concentration by changing the flow rate of inert gas to be introduced in the chamber (refer to the chamber 2 in FIG. 1A or 1B) covering the crucible, a method for controlling the oxygen concentration by changing the inner pressure in the CZ furnace, etc. have been proposed. The present inventors examined whether the oxygen concentration in the silicon single crystal can be changed by drastically changing the flow rate of inert gas to be introduced and the inner pressure in the CZ furnace using the CZ furnace shown in FIG. 1A or 1B. FIG. 9 shows the oxygen concentration in the silicon single crystal when the flow rate of inert gas and the inner pressure in the CZ furnace are changed, in which the number of rotations of the crucible per unit time is set to 0.5 rpm, and the oxygen concentration at a 300 mm location in the longitudinal direction of the silicon single crystal is measured. However, as shown in FIG. 9, the oxygen concentration in the silicon single crystal could not be notably changed.

This may be because, when a defect-free silicon single crystal is to be manufactured, the distance between the lower edge of the heat shield plate and the surface of the molten silicon needs to be longer (for example, 50 mm or longer) than in a normal case (for example, 20 mm), and thus the gas flow rate between the heat shield plate and the molten silicon does not change effectively even when the flow rate of inert gas and the inner pressure in the CZ furnace are changed, and as a result no effect is exerted on the molten silicon, which results in a small change in the oxygen concentration. Accordingly, the present inventors have determined that it is very difficult to control the oxygen concentration in the silicon single crystal by the flow rate of inert gas and the inner pressure in the CZ furnace under the conditions of manufacturing a defect-free silicon single crystal.

Then, the present inventors examined whether the oxygen concentration in the silicon single crystal can be changed in the longitudinal direction by using a multi-heater consisting of an upper heater (refer to the upper heater 22a in FIG. 1A) and a lower heater (refer to the lower heater 22b in FIG. 1A) located below this upper heater and changing the output ratio of the upper heater to the lower heater in the multi-heater (hereinafter, heater power ratio) in the longitudinal direction of the silicon single crystal. For the case where the heater power ratio is changed, the change in the oxygen concentration in the longitudinal direction of the silicon single crystal is shown in FIG. 10A, and the change in the height of the solid-liquid interface is shown in FIG. 10B.

Figure 10A:
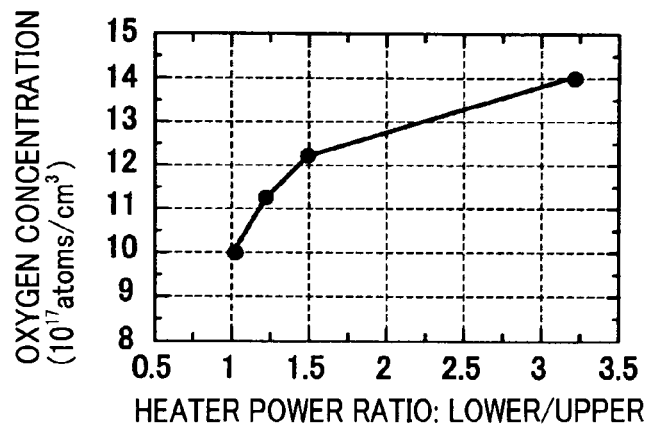
FIGS. 10A and 10B show the change in the oxygen concentration in the longitudinal direction of the silicon single crystal and the change in the height of the solid-liquid interface in the case that the heater power ratio is changed.

As shown in FIG. 10A, it is clear that, as the heater power ratio is raised, the oxygen concentration in the longitudinal direction of the silicon single crystal is raised to a certain extent. However, as shown in FIG. 10B, when the heater power ratio is changed, the height of the solid-liquid interface is also changed at the same time. That is, it is clear that, as the heater power ratio is raised, the height of the solid-liquid interface is also raised. This may be because the more the heater power ratio is raised, the more the bottom portion of the quartz crucible is heated, and thus the more the oxygen concentration in the silicon single crystal is raised. It may also be because, when the heater power ratio is raised, the temperature gradient in the up and down direction of the molten silicon becomes large, and thus the height (form) of the solid-liquid interface is raised due to the heat balance. Although FIGS. 10A and 10B show the oxygen concentration in the silicon single crystal and the height of the solid-liquid interface at a 450 mm location in the longitudinal direction of the silicon single crystal, the tendencies regarding the oxygen concentration in the silicon single crystal and the height of the solid-liquid interface were the same at other locations excluding the bottom side of the silicon single crystal.

Figure 10B:
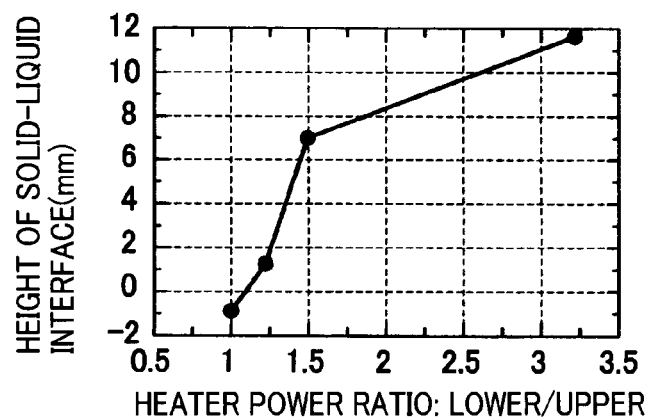

From the results in FIGS. 10A and 10B, in order to maintain constant oxygen concentration in the longitudinal direction of the silicon single crystal, the heater power ratio of the multi-heater should be changed so that the targeted oxygen concentration in the silicon single crystal can be achieved at each location in the longitudinal direction of the silicon single crystal. However, as the heater power ratio is changed, the height of the solid-liquid interface is changed. Further, as shown in FIG. 8, even if there is no change in the conditions of pulling up the silicon single crystal, the height of the solid-liquid interface is changed in some cases as the location in the longitudinal direction of the silicon single crystal differs. Accordingly, in order to achieve conditions for enabling stable manufacture of a defect-free silicon single crystal, the temperature gradient on the side surface of the crystal needs to be adjusted to control the height of the solid-liquid interface. The temperature gradient on the side surface of the crystal can be adjusted by adjusting the radiation environment that the side surface of the silicon single crystal is exposed to, for example, by adjusting the distance between the bottom surface of the heat shield plate and the surface of the molten silicon. However, by changing the distance between the lower edge of the heat shield plate and the surface of the molten silicon, the height of the solid-liquid interface changes.

It can be understood from the above results that the height of the solid-liquid interface and the oxygen concentration in the longitudinal direction of the silicon single crystal can be controlled by adjusting the output ratio of the multi-heater, that is, the heater power ratio. Also, in consideration of generally controlling the oxygen concentration in the silicon single crystal around 9 to $15 \times 10^{17}$ (atoms/cm$^3$), the heater power ratio is preferably 0.9 or more and 3.5 or less, and more preferably 0.9 or more and 1.5 or less. Meanwhile, when the aforementioned side heater 32 and the bottom heater 34 (refer to FIG. 1B) are used, the output ratio of the side heater 32 to the bottom heater 34 is preferably 0.9 or more and 3.5 or less, and more preferably 0.9 or more and 1.5 or less.

Based on the above results, the present inventors have found that there is a need to adjust the number of rotations of the crucible per unit time, the number of rotations of the silicon single crystal per unit time, the heater power ratio, and the distance between the bottom surface of the heat shield plate and the surface of the molten silicon, and especially to maximize the height of the solid-liquid interface, in order to manufacture a defect-free silicon single crystal rapidly and stably by controlling the oxygen concentration in the longitudinal direction of the silicon single crystal in consideration of all the influence exerted by the number of rotations of the crucible per unit time, the number of rotations of the silicon single crystal per unit time, the heater power ratio, the location in the longitudinal direction of the silicon single crystal, the oxygen concentration in the silicon single crystal, the distance between the lower edge of the heat shield plate and the surface of the molten silicon, and the height of the solid-liquid interface.

Figure 11:
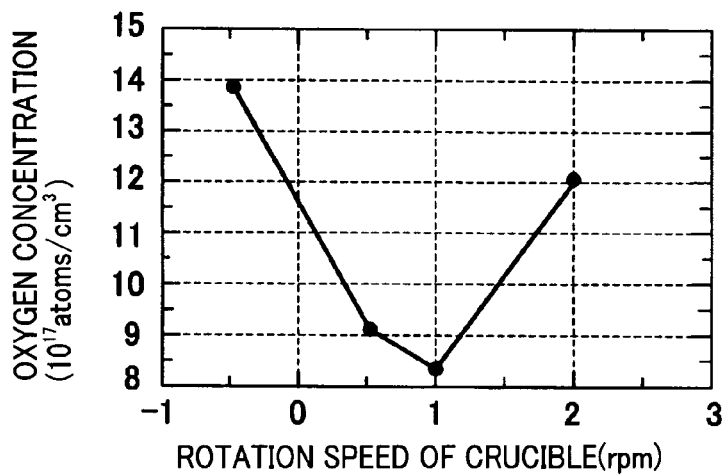
FIG. 11 shows the change in the oxygen concentration in the silicon single crystal at a 400 mm location in the longitudinal direction of the silicon single crystal when the number of rotations of the crucible per unit time is changed.
Figure 12A:
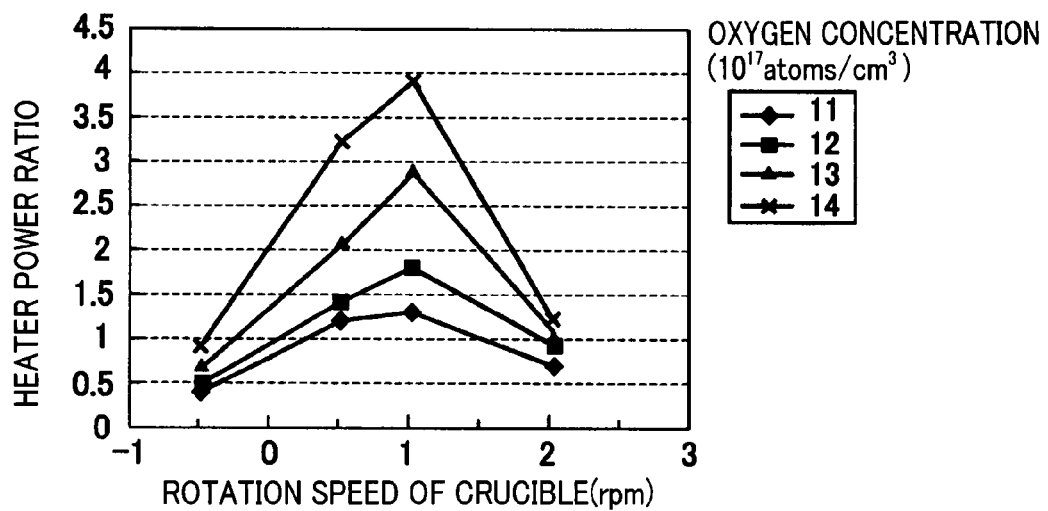
FIGS. 12A and 12B show the number of rotations of the crucible per unit time (horizontal axis) and the heater power ratio (vertical axis), and the number of rotations of the crucible per unit time (horizontal axis) and the height of the solid-liquid interface (vertical axis), to obtain each oxygen concentration at a 400 mm location in the longitudinal direction of the silicon single crystal.
Figure 12B:
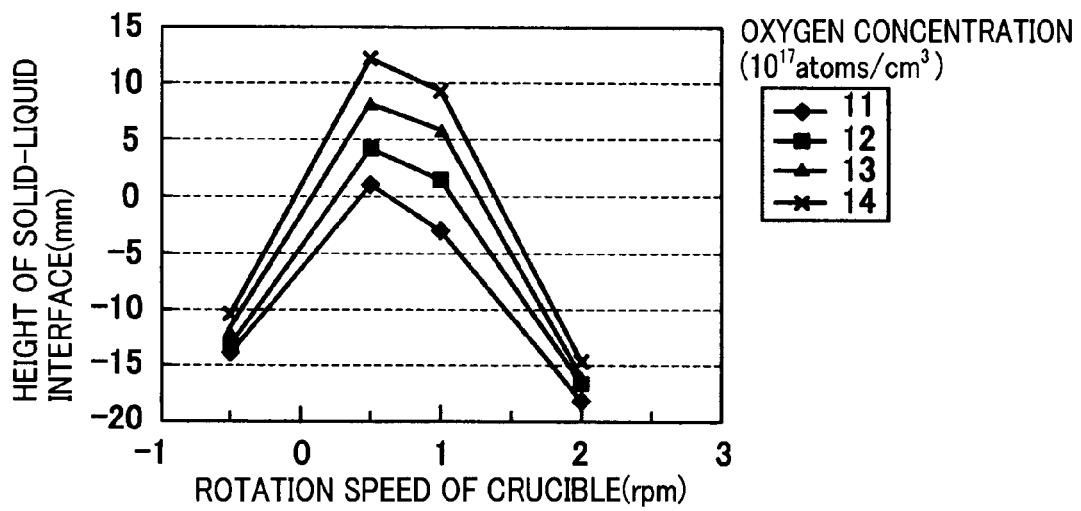

Then, the present inventors examined the number of rotations of the crucible per unit time based on FIGS. 11 to 12B, in consideration of the oxygen concentration in the silicon single crystal. FIG. 11 shows the change in the oxygen concentration in the silicon single crystal at a 400 mm location in the longitudinal direction of the silicon single crystal when the number of rotations of the crucible per unit time is changed. FIG. 12A shows the number of rotations of the crucible per unit time (horizontal axis) and the heater power ratio (vertical axis) to obtain each oxygen concentration at a 400 mm location in the longitudinal direction of the silicon single crystal. FIG. 12B shows the number of rotations of the crucible per unit time (horizontal axis) and the height of the solid-liquid interface (vertical axis) to obtain each oxygen concentration at a 400 mm location in the longitudinal direction of the silicon single crystal.

As shown in FIG. 11, when the number of rotations of the crucible per unit time is 0.5 rpm or more and 1 rpm or less, the oxygen concentration in the longitudinal direction of the silicon single crystal (8 to $9 \times 10^{17}$ atoms/cm$^3$) is the lowest. Thus, when the number of rotations of the crucible per unit time is set in the range from 0.5 rpm or more to 1 rpm or less, the oxygen concentration in the longitudinal direction of the silicon single crystal is the lowest among those in the cases of other ranges of the rotation speeds. Therefore, as shown in FIG. 12A, the oxygen concentration needs to be adjusted by raising the heater power ratio more than those in the cases of other ranges of the rotation speeds. When the heater power ratio is raised, the height of the solid-liquid interface is raised as shown in FIG. 12B. Also, when the number of rotations of the crucible per unit time is in the range from 0.5 rpm or more to 1 rpm or less, the solid-liquid interface is the highest as shown in FIG. 12B (or FIG. 7A). This is understandable in that the heater power ratio is maximum when the number of rotations of the crucible per unit time is in the range from 0.5 rpm or more to 1 rpm or less. From the above results, when the heater power ratio is further raised under conditions where the number of rotations of the crucible per unit time is in the range from 0.5 rpm or more to 1 rpm or less, the height of the solid-liquid interface is maximized as a matter of course. Thus, setting the number of rotations of the crucible per unit time to 0.5 rpm or more and 1 rpm or less as well as controlling the oxygen concentration in the silicon single crystal by the heater power ratio maximizes the height of the solid-liquid interface.

From the above results, the present inventors have obtained a new finding that it is important in manufacturing a defect-free silicon single crystal rapidly by controlling the oxygen concentration in the longitudinal direction of the silicon single crystal to control the oxygen concentration in the silicon single crystal by changing the heater power ratio in accordance with the location in the longitudinal direction of the silicon single crystal, setting the number of rotations of the crucible per unit time to 0.5 rpm or more and 1 rpm or less.

EMBODIMENTS

Figure 13:
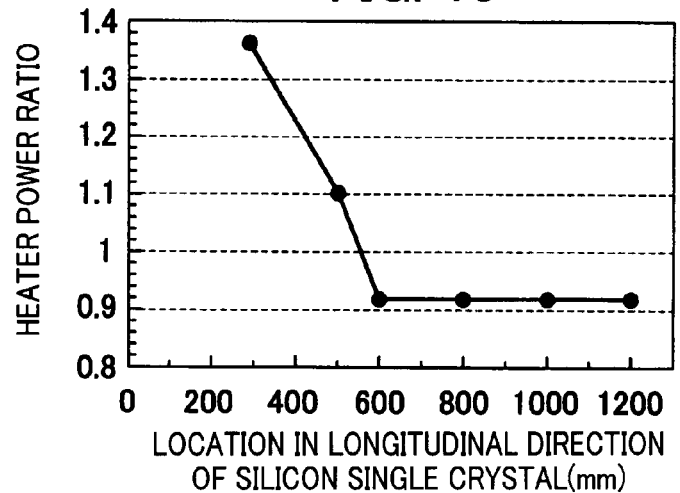
FIG. 13 shows the adjustment state of the heater power ratio at locations in the longitudinal direction of the silicon single crystal.
Figure 14:
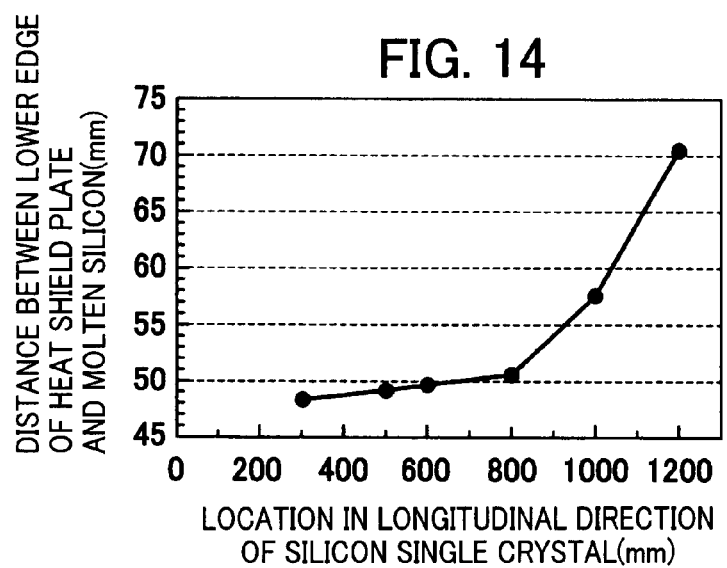
FIG. 14 shows the adjustment state of the distance between the heat shield plate and the molten silicon at locations in the longitudinal direction of the silicon single crystal.
Figure 15:
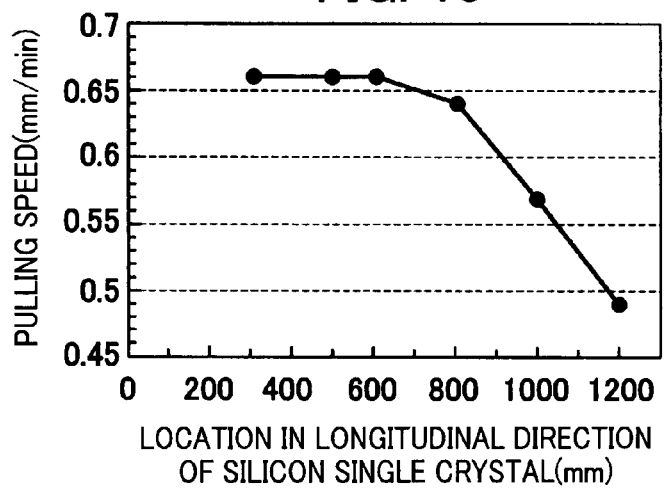
FIG. 15 shows the adjustment state of the pulling speed of the silicon single crystal at locations in the longitudinal direction of the silicon single crystal.

A silicon single crystal was developed in the CZ furnace shown in FIG. 1A or 1B in which a cooler in the 22-inch hot zone, a multi-heater consisting of an upper heater and a lower heater, and a heat shield plate were arranged, for the purpose of obtaining a defect-free crystal having a crystal diameter of 200 mm and an oxygen concentration of $11 \times 10^{17}$ atoms/cm$^3$ by changing the heater power ratio, the distance between the lower edge of the heat shield plate and the surface of the molten silicon, and the pulling speed of the silicon single crystal at locations in the longitudinal direction of the silicon single crystal as shown in FIGS. 13, 14 and 15. Meanwhile, it is preferable that the distance between the lower edge of the heat shield plate and the surface of the molten silicon is adjusted in the range from 45 mm or more to 75 mm or less, as shown in FIG. 14. Also, it is preferable that the pulling speed of the silicon single crystal is adjusted in the range from 0.45 mm/min or more to 0.70 mm/min or less, as shown in FIG. 15.

Meanwhile, the heater power ratio was changed at locations in the longitudinal direction of the silicon single crystal so that the oxygen concentration would be $11 \times 10^{17}$ atoms/cm$^3$, with reference to FIGS. 8 and 10A. Also, the distance between the lower edge of the heat shield plate and the surface of the molten silicon and the pulling speed of the silicon single crystal were determined in advance to maximize the allowable range of the pulling speed of the silicon single crystal which allows the manufacture a defect-free silicon single crystal, on the assumption of changes in the interface height caused by changes in the heater power ratio in the longitudinal direction of the silicon single crystal. Also, the length of the cooler was set to 100 mm, and the internal diameter of the cooler was set to 270 mm. Also, as conditions for developing the silicon single crystal, the rotation speed of the crystal was set to 18 rpm, and the rotation speed of the crucible was set to 0.5 rpm (reverse rotation from rotation of the crystal).

Figure 16:
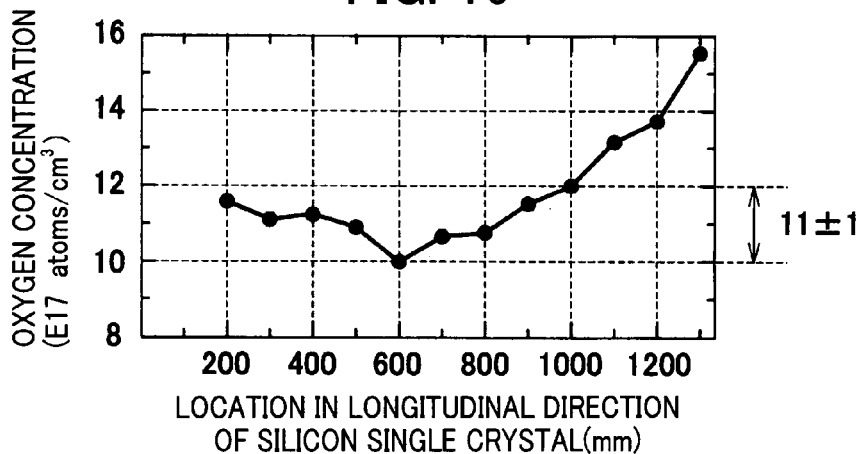
FIG. 16 shows the change in the oxygen concentration in the silicon single crystal at locations in the longitudinal direction of the silicon single crystal.
Figure 17:
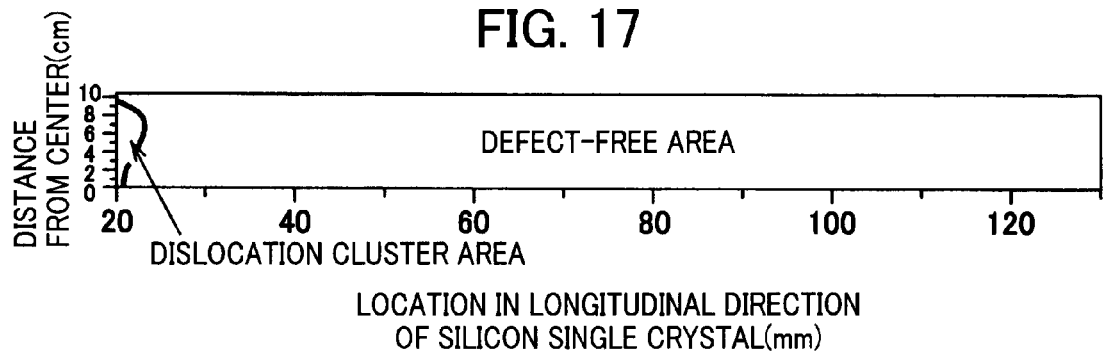
FIG. 17 shows the defect distribution at locations in the longitudinal direction of the silicon single crystal evaluated by X-ray topography.
Figure 18:
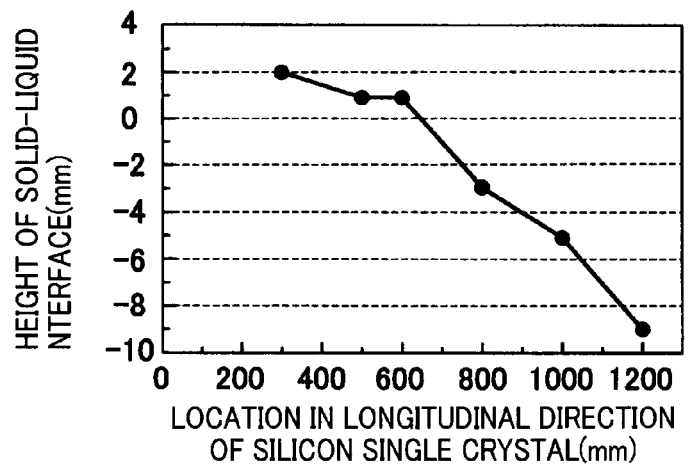
FIG. 18 shows the change in the height of the solid-liquid interface at locations in the longitudinal direction of the silicon single crystal.
Figure 19:
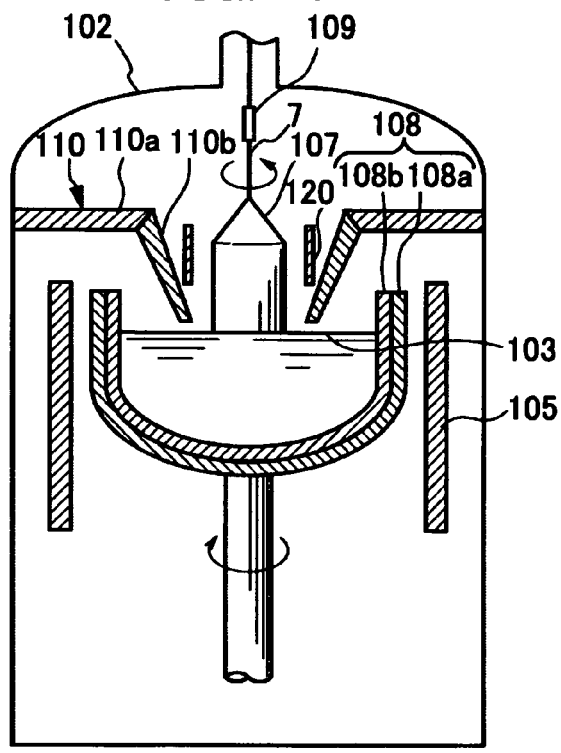
FIG. 19 is a cross-sectional view schematically showing a conventional CZ furnace.

The manufactured silicon single crystal was evaluated in terms of the oxygen concentration, defect distribution and interface form. The defect distribution was evaluated by cutting the crystal longitudinally, thereafter performing a Cu decoration, and taking an X-ray topograph. At the same time, the presence of defects was checked by observation through a microscope after Secco etching. Also, the form of the solid-liquid interface was checked by observing growth striation on the X-ray topograph image of the longitudinally-cut specimen. FIG. 16 shows the changes in the oxygen concentration in the silicon single crystal at locations in the longitudinal direction of the silicon single crystal. FIG. 17 shows the defect distribution at locations in the longitudinal direction of the silicon single crystal evaluated by the X-ray topograph. FIG. 18 shows the changes in the height of the solid-liquid interface at locations in the longitudinal direction of the silicon single crystal.

As shown in FIG. 16, it can be confirmed that the oxygen concentration is controlled within $11 \pm 1 \times 10^{17}$ (atoms/cm$^3$) in the range from 200 mm to 1000 mm in the longitudinal direction of the silicon single crystal. Also, as shown in FIG. 17, no defect areas for void defects and dislocation cluster defects were found. No crystal defects were detected in evaluation by Secco etching. Also, as shown in FIG. 18, changes in the height of the solid-liquid interface correspond to changes in the distance between the heat shield plate and the molten silicon in FIG. 14. Thus, the distance between the heat shield plate and the molten silicon is shorter at locations where the solid-liquid interface is higher, which means that the temperature gradient on the side surface of the crystal is raised. Accordingly, it has been confirmed that the temperature gradient on the side surface of the crystal is controlled in accordance with a targeted solid-liquid interface. The average pulling speed of the silicon single crystal was approximately 0.60 mm/min, and a defect-free crystal could be manufactured more rapidly than in a conventional case (approximately 0.43 mm/min) by 0.1 mm/min or more.

While the preferred embodiments of the present invention have been described and illustrated above, it is to be understood that they are exemplary of the invention and are not to be considered to be limiting. Additions, omissions, substitutions, and other modifications can be made thereto without departing from the spirit or scope of the present invention. Accordingly, the invention is not to be considered to be limited by the foregoing description and is only limited by the scope of the appended claims.

What is claimed is:

1. A method for manufacturing a defect-free silicon single crystal by the CZ method, comprising the steps of:

disposing a heat shield plate to surround the silicon single crystal and cylindrical cooler around the silicon single crystal inside the heat shield plate and adjusting an amount of radiant heat radiated onto the silicon single crystal; and by adjusting a pulling speed of the silicon single crystal, a rotation speed of a crucible that stores molten silicon and a rotation speed of the silicon single crystal, and an output ratio of a multi-heater separated into at least two parts in the longitudinal direction of the silicon single crystal disposed around the crucible, controlling a temperature gradient on a side surface of the silicon single crystal in the longitudinal direction of the silicon single crystal, a height of a solid-liquid interface, and an oxygen concentration in the longitudinal direction of the silicon single crystal, to manufacture a defect-free silicon single crystal, wherein the rotation speed of the crucible is set to 0.5 rpm or more 1 rpm or less, the output of a lower part of the multi-heater in the longitudinal direction is changed depending on the position of the silicon single crystal in the longitudinal direction so as to control the oxygen concentration of the silicon single crystal to a predetermined value, the pulling speed of the silicon single crystal is increased in a first portion of a pulling up of the silicon single crystal as compared with a latter portion thereof, and a distance between a lower edge of the heat shield plate and a surface of the molten silicon is increased when the silicon single crystal is raised in the longitudinal direction in response to the pulling up of the silicon single crystal.

2. The method according to claim 1, wherein the multi-heater consists of an upper heater and a lower heater located below the upper heater, and the output ratio of the lower heater to the upper heater is set to 0.9 or more and 3.5 or less.

3. The method according to claim 2, wherein the output ratio is set to 0.9 or more and 1.5 or less.

4. The method according to claim 2, wherein the rotation speed of the silicon single crystal is set to 18 rpm or more and 20 rpm or less in a reverse direction of the rotation of the crucible.

5. The method according to claim 2, wherein the distance between the lower edge of the heat shield plate and the surface of the molten silicon is adjusted in a range from 45 mm or more to 75 mm or less, and the pulling speed of the silicon single crystal is adjusted in a range from 0.45 mm/min or more to 0.70 mm/min or less.

6. The method according to claim 1, wherein the multi-heater consists of a cylindrical side heater disposed around the crucible and a bottom heater disposed on a lower side of the crucible, and the output ratio of the bottom heater to the side heater is set to 0.9 or more and 3.5 or less.

7. The method according to claim 6, wherein the output ratio is set to 0.9 or more and 1.5 or less.

8. The method according to claim 1, wherein the rotation speed of the silicon single crystal is set to 18 rpm or more and 20 rpm or less in a reverse direction of the rotation of the crucible.

9. The method according to claim 1, wherein a distance between the lower edge of the heat shield plate and the surface of the molten silicon is adjusted in a range from 45 mm or more to 75 mm or less, and the pulling speed of the silicon single crystal is adjusted in a range from 0.45 mm/min or more to 0.70 mm/min or less.

10. The method according to claim 1, wherein a magnetic field is applied to the molten silicon.

11. The method according to claim 1, further comprising melting silicon with the at least two parts of the multi-heater.

12. A method for manufacturing a defect-free silicon single crystal by the CZ method, comprising the step of:

disposing a heat shield plate to surround the silicon single crystal, and adjusting an amount of radiant heat radiated onto the silicon single crystal; and by adjusting a pulling speed of the silicon single crystal, a rotation speed of a crucible that stores molten silicon and a rotation speed of the silicon single crystal, and an output ratio of a multi-heater separated into at least two parts in the longitudinal direction of the silicon single crystal disposed around the crucible, controlling a temperature gradient on the side surface of the silicon single crystal in the longitudinal direction of the silicon single crystal, a height of a solid-liquid interface, and an oxygen concentration in the longitudinal direction of the silicon single crystal, to manufacture a defect-free silicon single crystal, wherein the rotation speed of the crucible is set to 0.5 rpm or more to 1 rpm or less, the output ratio of a lower part of the multi-heater in the longitudinal direction is changed depending on the position of the silicon single crystal in the longitudinal direction so as to control the oxygen concentration of the silicon single crystal to a predetermined value, the pulling speed of the silicon single crystal is increased in a first portion of a pulling up of the silicon single crystal as compared with a latter portion thereof, and a distance between a lower edge of the heat shield plate and a surface of the molten silicon is increased when the silicon single crystal is raised in the longitudinal direction in response to the pulling up of the silicon single crystal.

13. The method according to claim 12, wherein the output ratio is set to 0.9 or more and 3.5 or less.

14. The method according to claim 12, wherein the rotation speed of the silicon single crystal is set to 18 rpm or more and 20 rpm or less in a reverse direction of the rotation of the crucible.

15. The method according to claim 14, wherein the rotation speed of the silicon single crystal is set to 18 rpm or more and 20 rpm or less in a reverse direction of the rotation of the crucible.

16. The method according to claim 12, wherein a magnetic field is applied to the molten silicon.

* * * * *

UNITED STATES PATENT AND TRADEMARK OFFICE
CERTIFICATE OF CORRECTION

PATENT NO. : 7,524,371 B2  Page 1 of 1
APPLICATION NO. : 11/728739
DATED : April 28, 2009
INVENTOR(S) : Takashi Yokoyama et al.

It is certified that error appears in the above-identified patent and that said Letters Patent is hereby corrected as shown below:

Title Page Item (75), second Inventor's name should read Toshiaki Saishoji

Signed and Sealed this

Twenty-first Day of July, 2009

JOHN DOLL
*Acting Director of the United States Patent and Trademark Office*